United States Patent
Hsu et al.

(10) Patent No.: US 10,700,674 B1
(45) Date of Patent: Jun. 30, 2020

(54) DIFFERENTIAL COMPARATOR CIRCUIT

(71) Applicant: NOVATEK Microelectronics Corp., Hsinchu (TW)

(72) Inventors: Pai-Hsiang Hsu, Hsinchu (TW); Chao-Yu Meng, Hsinchu (TW)

(73) Assignee: NOVATEK Microelectronics Corp, Hsinchu (TW)

( * ) Notice: Subject to any disclaimer, the term of this patent is extended or adjusted under 35 U.S.C. 154(b) by 0 days.

(21) Appl. No.: 16/542,275

(22) Filed: Aug. 15, 2019

(51) Int. Cl.
*H03M 1/12* (2006.01)
*H03K 5/24* (2006.01)

(52) U.S. Cl.
CPC .................. *H03K 5/2481* (2013.01)

(58) Field of Classification Search
CPC ....... G11C 5/145; G11C 5/147; G11C 11/406; G11C 11/40615; G11C 2211/4067; H03M 1/1245; H03M 1/32; H03M 1/46
See application file for complete search history.

(56) References Cited

U.S. PATENT DOCUMENTS

| | | |
|---|---|---|
| 7,609,093 B2 | 10/2009 | Sarig et al. |
| 8,259,196 B2 | 9/2012 | Yoshikawa et al. |
| 9,312,841 B2 | 4/2016 | Rysinski et al. |
| 9,860,468 B2 | 1/2018 | Nishimura et al. |
| 9,906,212 B2 | 2/2018 | Sugiyama et al. |
| 9,967,496 B2 | 5/2018 | Ayers et al. |
| 10,237,504 B2 | 3/2019 | Tanaka |
| 2008/0079492 A1* | 4/2008 | Kobayashi ................ H03F 1/26 330/261 |

* cited by examiner

*Primary Examiner* — Sibin Chen
(74) *Attorney, Agent, or Firm* — CKC & Partners Co., LLC

(57) ABSTRACT

A differential comparator circuit is provided that includes a differential input pair, an active load, a pair of cross voltage generation devices and a pair of switches. The differential input pair has a pair of input terminals and a pair of first connection terminals. The active load has a pair of second connection terminals. The cross voltage generation devices are electrically coupled between the first connection terminals and the second connection terminals, wherein the cross voltage generation devices are configured to be electrically activated to establish a cross voltage therebetween in a reset phase and electrically deactivated to become a short circuit in an operation phase. The switches are configured to electrically couple the pair of input terminals respectively to the pair of first connection terminals in the reset phase and not electrically couple the pair of input terminals respectively from the pair of first connection terminals.

11 Claims, 7 Drawing Sheets

DIFFERENTIAL COMPARATOR CIRCUIT

BACKGROUND

Field of Disclosure

The present disclosure relates to a comparator circuitry technology. More particularly, the present disclosure relates to a differential comparator circuit.

Description of Related Art

A conventional integrated CMOS image sensor contains a matrix of analog pixels and a set of analog-to-digital (A/D) converters that transform, in real time, the analog signal from the pixels into a digital form. One of the most important components of the A/D converter is a CMOS analog voltage comparator. Such a comparator usually consists of a conventional MOS differential pair with a current mirror as an active load. However, the input range of the differential pair is limited due to the reset mechanism.

Accordingly, what is needed is a differential comparator circuit to address the above issues.

SUMMARY

An aspect of the present disclosure is to provide a differential comparator circuit that includes a differential input pair, an active load and a pair of cross voltage generation devices. The differential input pair has a pair of input terminals and a pair of first connection terminals. The active load has a pair of second connection terminals. The pair of cross voltage generation devices are electrically coupled between the pair of first connection terminals and the pair of second connection terminals, wherein the pair of cross voltage generation devices are configured to be electrically activated to establish a cross voltage therebetween in a reset phase and electrically deactivated to become a short circuit in an operation phase. The pair of switches configured to electrically couple the pair of input terminals respectively to the pair of first connection terminals in the reset phase and not electrically couple the pair of input terminals respectively from the pair of first connection terminals such that the pair of input terminals respectively receive a signal input and a reference input in the operation phase.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
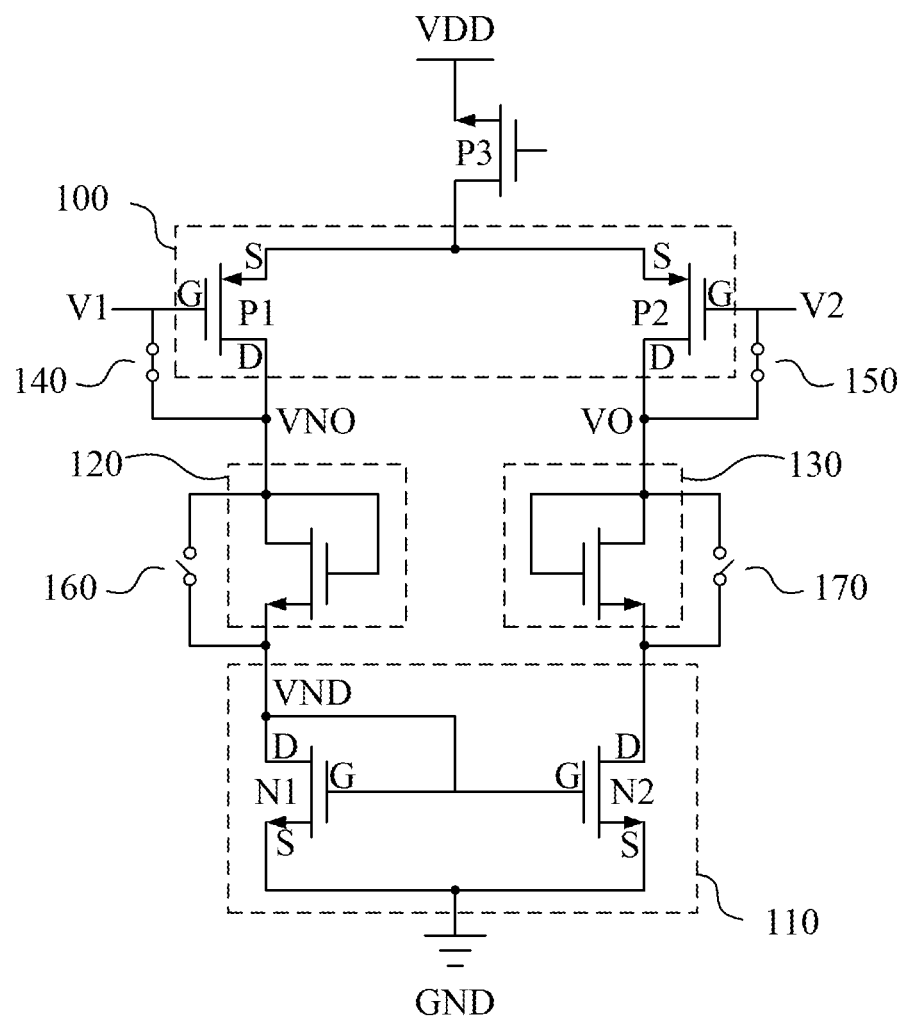
FIG. 1A is a circuit diagram of a differential comparator circuit in a reset phase in an embodiment of the present invention.

Reference will now be made in detail to the present embodiments of the disclosure, examples of which are illustrated in the accompanying drawings. Wherever possible, the same reference numbers are used in the drawings and the description to refer to the same or like parts.

Figure 1B:
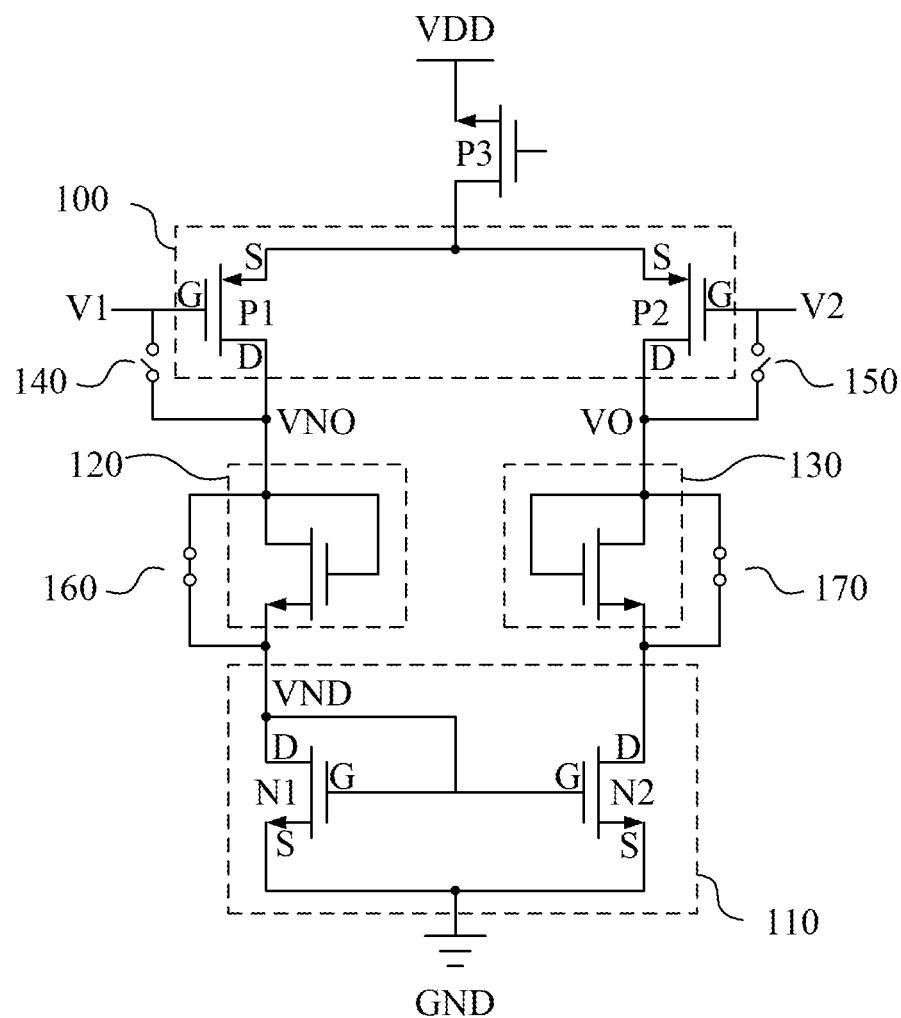
FIG. 1B is a circuit diagram of a differential comparator circuit in an operation phase in an embodiment of the present invention.

Reference is now made to FIG. 1A and FIG. 1B at the same time. FIG. 1A is a circuit diagram of a differential comparator circuit 1 in a reset phase in an embodiment of the present invention. FIG. 1B is a circuit diagram of a differential comparator circuit 1 in an operation phase in an embodiment of the present invention.

The differential comparator circuit 1 including a differential input pair 100, an active load 110, a pair of cross voltage generation devices 120 and 130 and pair of switches 140 and 150.

In an embodiment, the differential input pair 100 includes PMOS transistors P1 and P2. Each of the PMOS transistors P1 and P2 includes a gate, a source and a drain that are labeled as G, S and D respectively.

The sources of the PMOS transistors P1 and P2 are electrically coupled to a voltage source VDD through a driving transistor P3 in the present embodiment. The gates of the PMOS transistors P1 and P2 act as a pair of input terminals, in which the gate of the PMOS transistor P1 is a reference input terminal that has a voltage level V1, and the gate of the PMOS transistor P2 is a signal input terminal that has a voltage level V2.

The drains of the PMOS transistors P1 and P2 act as a pair of first connection terminals. In an embodiment, the drain of the PMOS transistor P1 acts as a non-output terminal that has a voltage level VNO, and the drain of the PMOS transistor P2 acts as an output terminal that has a voltage level VO.

In an embodiment, the active load 110 includes NMOS transistors N1 and N2. Each of the NMOS transistors N1 and N2 includes a gate, a source and a drain that are labeled as G, S and D respectively.

The sources of the NMOS transistors N1 and N2 are electrically coupled to a ground terminal GND in the present embodiment. The gates of the NMOS transistors N1 and N2 are electrically coupled together. The drains of the NMOS transistors N1 and N2 act as a pair of second connection terminals, wherein the drain of the NMOS transistor N1 is electrically coupled to the gates of the NMOS transistors N1 and N2. In an embodiment, the drain of the NMOS transistor N1 has a voltage level VND.

The pair of cross voltage generation devices 120 and 130 are electrically coupled between the pair of first connection terminals and the pair of second connection terminals. More specifically, the cross voltage generation device 120 is electrically coupled between the drain of the PMOS transistor P1 and the drain of the NMOS transistor N1. The cross voltage generation device 130 is electrically coupled between the drain of the PMOS transistor P2 and the drain of the NMOS transistor N2.

In the present embodiment, each the cross voltage generation devices 120 and 130 is a diode-connected transistor. More specifically, in the present embodiment, each of the cross voltage generation devices 120 and 130 is a NMOS transistor having the gate and the source thereof electrically coupled together.

The pair of switches 140 and 150 are disposed respectively between the pair of input terminals and the pair of first connection terminals. More specifically, the switch 140 is disposed between the gate and the drain of the PMOS transistor P1, and the switch 150 is disposed between the gate and the drain of the PMOS transistor P2.

The operation of the differential comparator circuit 1 is further described in the following paragraphs.

In the reset phase, as illustrated in FIG. 1A, the pair of switches 140 and 150 electrically couple the pair of input terminals respectively to the pair of first connection terminals. More specifically, the switch 140 electrically couples the gate and the drain of the PMOS transistor P1, and the switch 150 electrically couples the gate and the drain of the PMOS transistor P2.

Further, in the reset phase, the pair of cross voltage generation devices 120 and 130 are electrically activated to establish a cross voltage therebetween.

In an embodiment, the differential comparator circuit 1 further includes a pair of control switches 160 and 170 disposed respectively between the two terminals of each of the cross voltage generation devices 120 and 130. More specifically, the control switch 160 is disposed between the two terminals of the cross voltage generation device 120, and the control switch 170 is disposed between the two terminals of the cross voltage generation device 130.

In the reset phase, the control switch 160 is configured to not electrically couple the two terminals of the cross voltage generation device 120 such that the cross voltage generation device 120 is electrically activated to establish a cross voltage. Likewise, the control switch 170 is configured to not electrically couple the two terminals of the cross voltage generation device 130 such that the cross voltage generation device 130 is electrically activated to establish a cross voltage therebetween.

Figure 2:
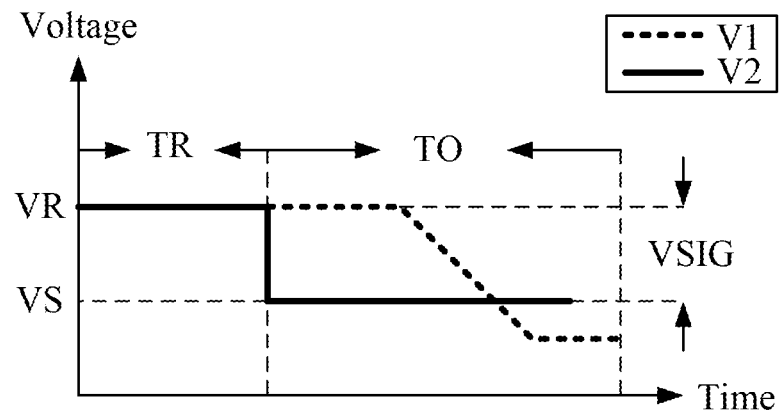
FIG. 2 is a waveform diagram of the waveforms of the voltage level of the reference input terminal and the voltage level of the signal input terminal during the reset phase and the operation phase in an embodiment of the present invention.

Reference is now made to FIG. 2. FIG. 2 is a waveform diagram of the waveforms of the voltage level V1 of the reference input terminal and the voltage level V2 of the signal input terminal during the reset phase TR and the operation phase TO in an embodiment of the present invention. In FIG. 2, the waveform of the voltage level V1 is illustrated by a dotted line, and the waveform of the voltage level V2 is illustrated by a solid line.

In the reset phase TR, the voltage level V1 of the reference input terminal and the voltage level V2 of the signal input terminal are reset to a reset voltage level VR. Since the reference input terminal and the non-output terminal are electrically coupled, and the signal input terminal and the output terminal are electrically coupled, the voltage level VNO of the non-output terminal and the voltage level VO of the output terminal are reset to the reset voltage level VR as well.

Further, the cross voltage generation devices 120 and 130 respectively establish a cross voltage VC1 (not labeled) and the NMOS transistors N1 and N2 of the active load 110 respectively establish another cross voltage VC2 (not labeled). As a result, the reset voltage level VR equals to the sum of the cross voltage VC1 and the cross voltage VC2. Such relation can be expressed as:

$$V1=V2=VR=VC1+VC2 \qquad \text{(equation 1)}.$$

It is appreciated that in the present embodiment, the active load 110 is electrically coupled to the ground terminal GND such that the reset voltage level equals to the sum of the cross voltage VC1 and the cross voltage VC2. In other embodiments, when the active load 110 is electrically coupled to the ground terminal GND through other electrical components, the reset voltage level become larger than the sum of the cross voltage VC1 and the cross voltage VC2 due to the cross voltage generated by the additional electrical components.

In the operation phase, as illustrated in FIG. 1B, the pair of switches 140 and 150 do not electrically couple the pair of input terminals respectively from the pair of first connection terminals. More specifically, the switch 140 does not electrically couple the gate and the drain of the PMOS transistor P1, and the switch 150 does not electrically couples the gate and the drain of the PMOS transistor P2.

Further, in the operation phase, the pair of cross voltage generation devices 120 and 130 are electrically deactivated to become a short circuit.

More specifically, in the operation phase, the control switch 160 is configured to electrically couple the two terminals of the cross voltage generation device 120 such that the cross voltage generation device 120 becomes a short circuit. Likewise, the control switch 170 is configured to electrically couple the two terminals of the cross voltage generation device 130 such that the cross voltage generation device 130 becomes a short circuit.

As illustrated in FIG. 2, in the operation phase TO, the signal input terminal is configured to receive a signal input such that the voltage level V2 becomes a signal input level VS, in which the voltage difference between the reset voltage level VR and the signal input level VS is VSIG.

On the other hand, the voltage level V1 of the reference input terminal ramps down from the reset voltage level VR to the signal input level VS during the operation phase.

Moreover, during the operation, the voltage level VNO of the non-output terminal and the voltage level of one of the second connection terminals of the active load 110 electrically coupled to the non-output terminal due to the short circuit formed by the electrically deactivated cross voltage generation device 120 are the same, in which the voltage level VNO equals to the cross voltage VC2 established by the NMOS transistor N1 of the active load 110.

As a result, when the voltage level V1 ramps down to the signal input level VS, the lowest possible value of the voltage level V1 under such a condition that is able to keep the PMOS transistor P1 operating in the saturation region can be expressed as:

$$V1=VR-VSIG>VC2-|VTHP| \qquad \text{(equation 2)}.$$

In equation 2, the voltage VTHP is the threshold voltage of the PMOS transistor P1.

According to equation 1, the reset voltage level VR=VC1+VC2. As a result, the largest possible value of the voltage difference VSIG under such a condition that is able to keep the PMOS transistor P1 operating in the saturation region can be expressed as:

$$VSIG<|VTHP|+VC1 \qquad \text{(equation 3)}.$$

In some approaches, the cross voltage generation devices 120 and 130 are not presented such that the voltage level V1 of the reference input terminal and the voltage level V2 of the signal input terminal are reset to a reset voltage value that equals to only the cross voltage VC2 established by the NMOS transistor N1 of the active load 110.

Under such a condition, the largest possible value of the voltage difference VSIG that is able to keep the PMOS transistor P1 operating in the saturation region is expressed as:

$$VSIG<|VTHP| \quad \text{(equation 4)}.$$

As a result, the voltage difference VSIG can not exceed |VTHP| such that the range of the signal input received by the differential input pair 100 is limited.

On the contrary, the differential comparator circuit 1 of the present invention increases the reset voltage level by using the cross voltage generation devices 120 and 130 to further increase the range of the signal input received by the differential input pair 100. The operation of the differential comparator circuit 1 can thus be more elastic.

Reference is now made to FIG. 3A to FIG. 3D. FIG. 3A to FIG. 3D are circuit diagrams of the differential comparator circuit 1 having different types of the cross voltage generation devices 120 and 130 in different embodiments of the present invention.

Figure 3A:
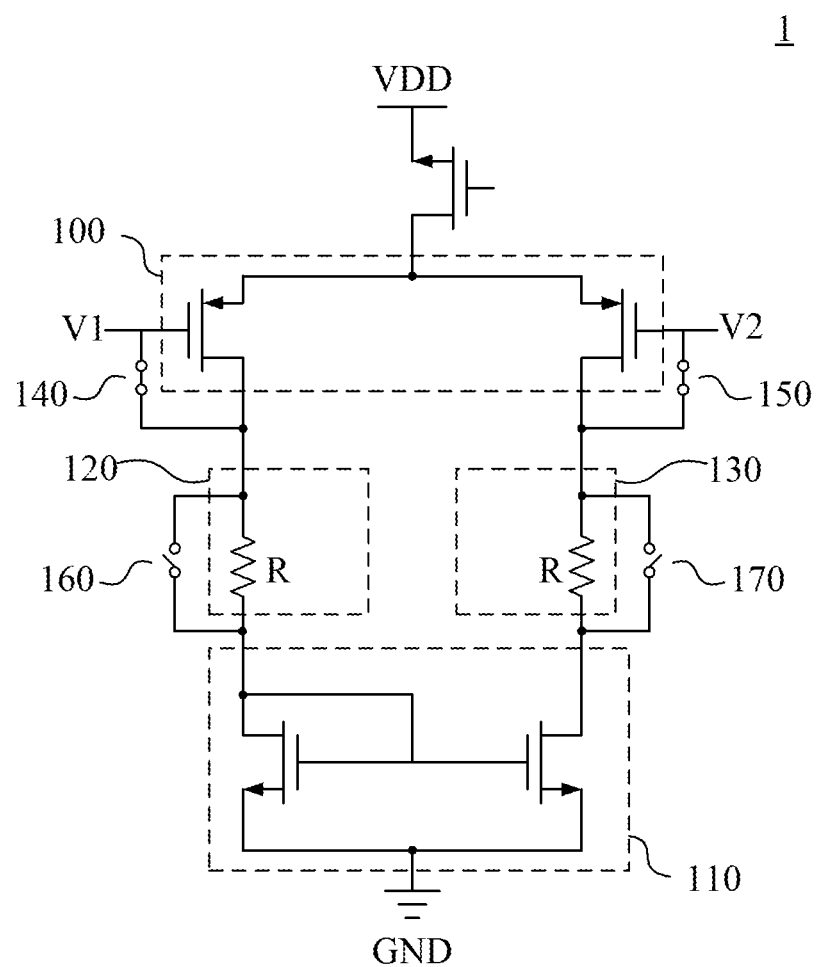
FIG. 3A to FIG. 3D are circuit diagrams of the differential comparator circuit having different types of the cross voltage generation devices in different embodiments of the present invention.
Figure 3B:
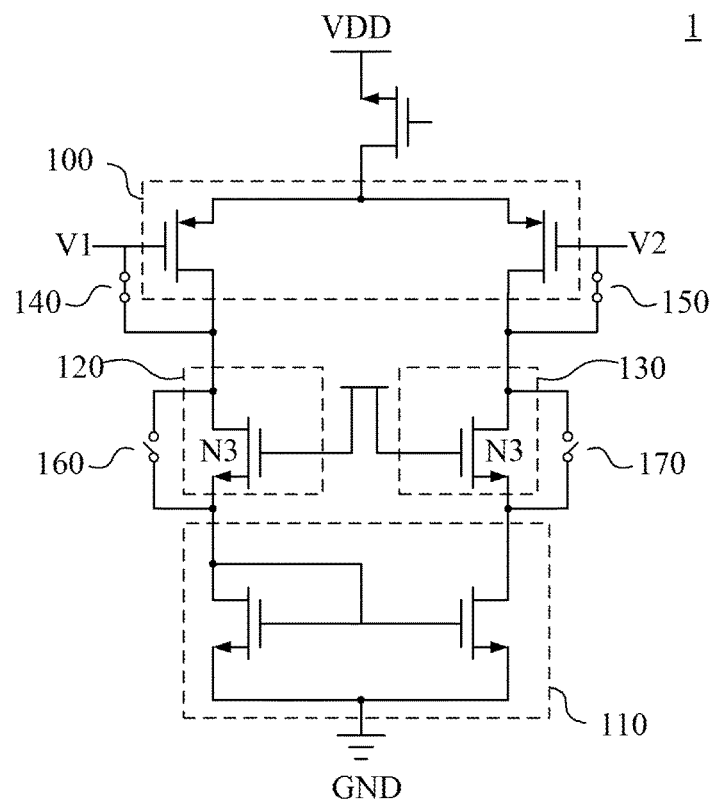
Figure 3C:
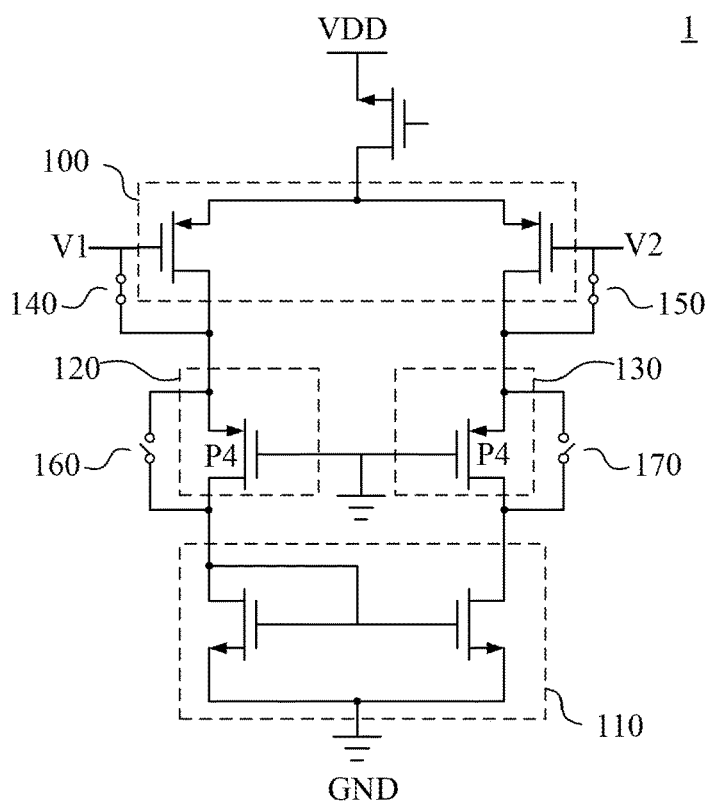
Figure 3D:
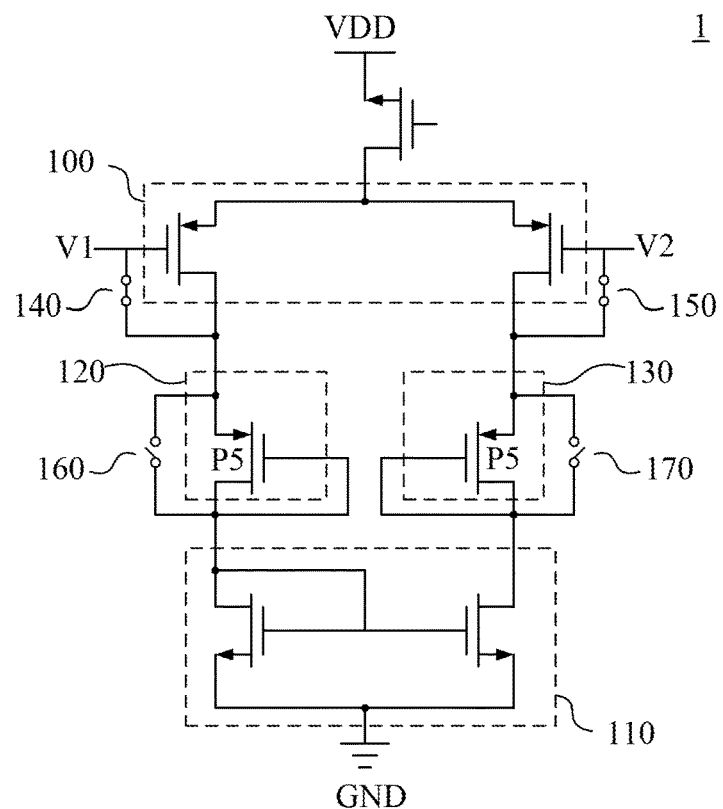

In different embodiments, each of the cross voltage generation devices 120 and 130 may include a resistor R illustrated in FIG. 3A, a biased NMOS transistor N3 illustrated in FIG. 3B, a biased PMOS transistor P4 illustrated in FIG. 3C, a diode-connected PMOS transistor P5 illustrated in FIG. 3D or a combination thereof. Further, the number of the element included in the each of the cross voltage generation devices 120 and 130 illustrated in FIG. 3A to FIG. 3D can be at least one and can be electrically coupled to each other in parallel, in series or a combination thereof.

Reference is now made to FIG. 4A to FIG. 4D. FIG. 4A to FIG. 4D are circuit diagrams of the differential comparator circuit 1 having different types of the cross voltage generation devices 120 and 130 in different embodiments of the present invention.

Figure 4A:
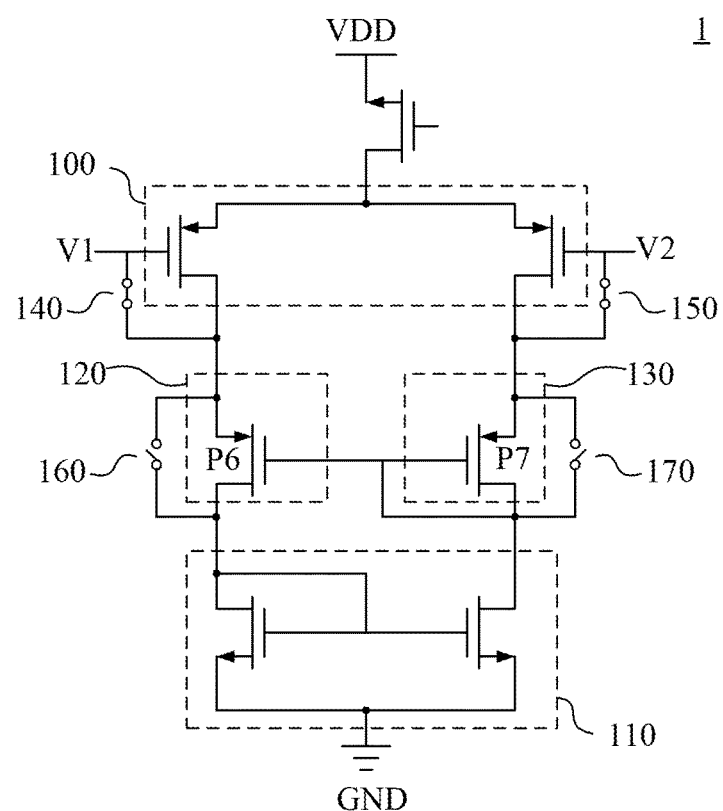
FIG. 4A to FIG. 4D are circuit diagrams of the differential comparator circuit having different types of the cross voltage generation devices in different embodiments of the present invention.
Figure 4B:
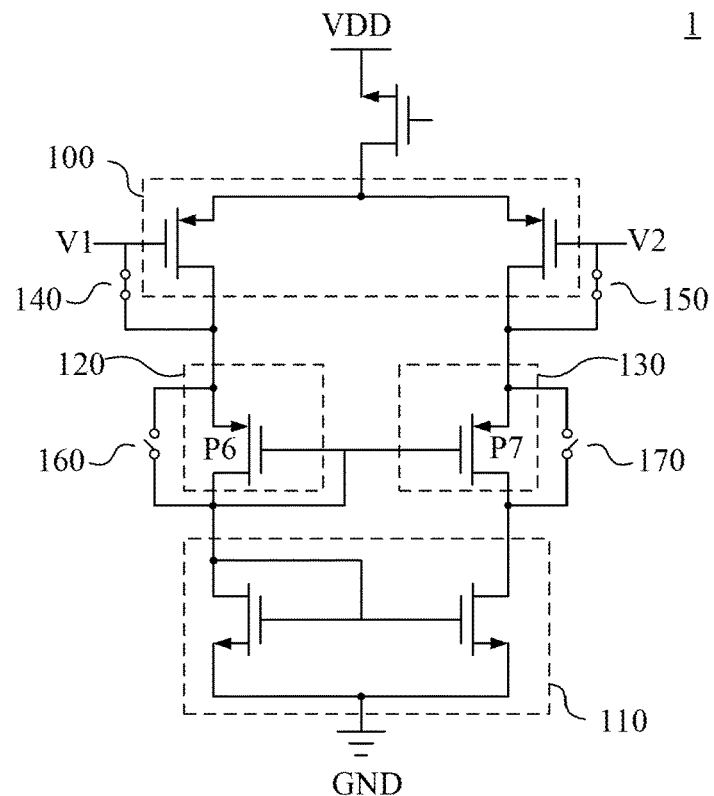
Figure 4C:
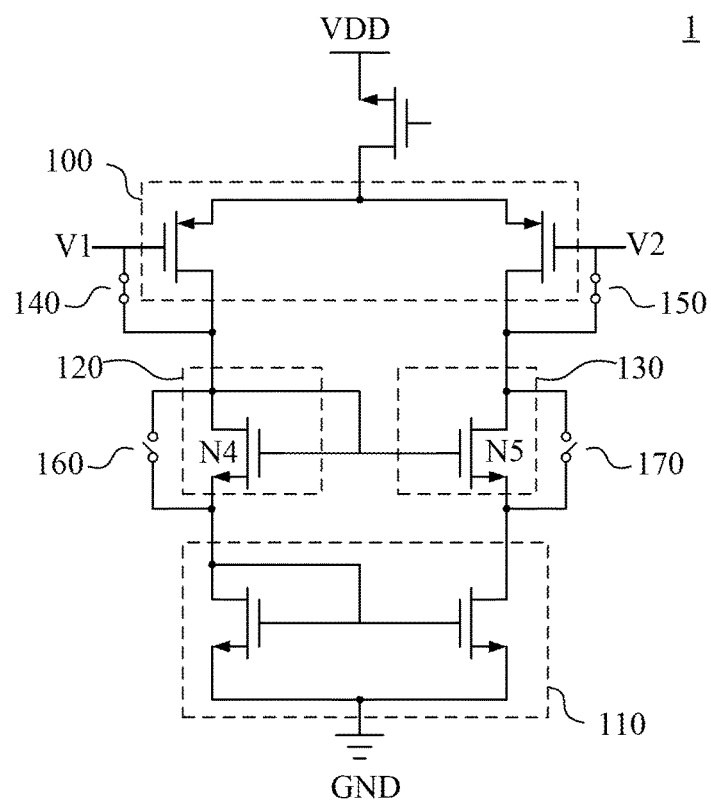
Figure 4D:
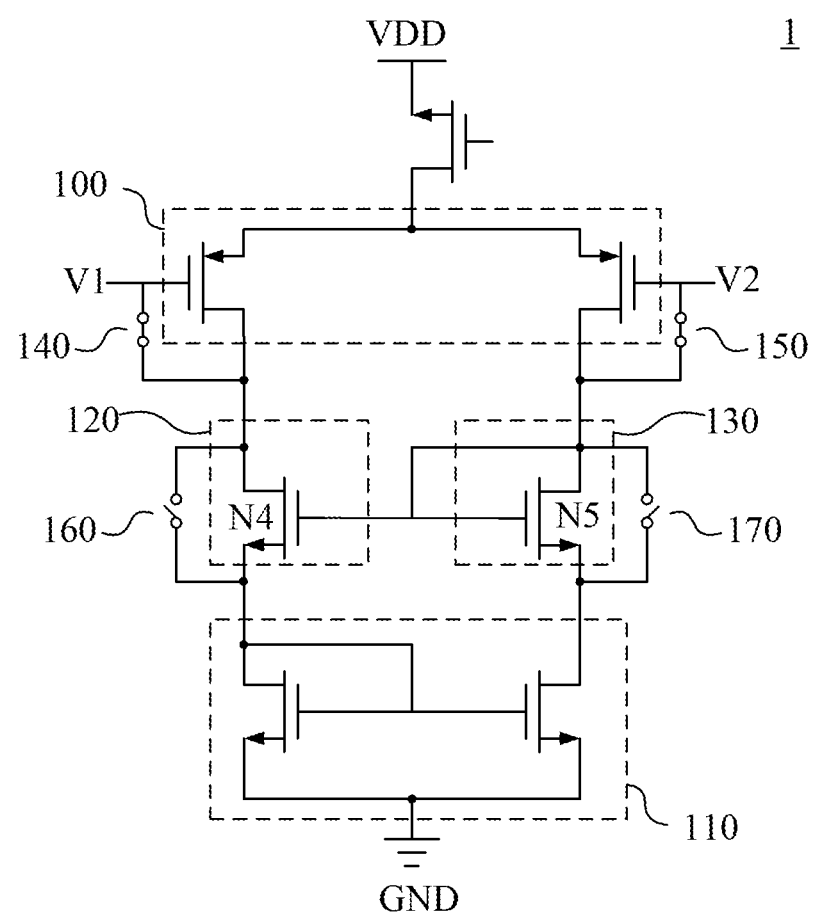

In different embodiments, the cross voltage generation devices 120 and 130 may form a current load, such as the current load implemented by two PMOS transistors P6 and P7 illustrated in FIG. 4A and FIG. 4B or the current load implemented by two NMOS transistors N4 and N5 illustrated in FIG. 4C and FIG. 4D, in which the current load illustrated in FIG. 4A is the inverse of the current load illustrated in FIG. 4B, and the current load illustrated in FIG. 4C is the inverse of the current load illustrated in FIG. 4D.

It is appreciated that in other embodiments, the differential input pair 100 can be implemented by NMOS transistors while the active load 110 can be implemented by PMOS transistors. The detail of such configuration is not illustrated and described herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A differential comparator circuit comprises:
    a differential input pair having a pair of input terminals and a pair of first connection terminals;
    an active load having a pair of second connection terminals;
    a pair of cross voltage generation devices electrically coupled between the pair of first connection terminals and the pair of second connection terminals, wherein the pair of cross voltage generation devices are configured to be electrically activated to establish a cross voltage therebetween in a reset phase and electrically deactivated to become a short circuit in an operation phase; and
    a pair of switches configured to electrically couple the pair of input terminals respectively to the pair of first connection terminals in the reset phase and not electrically couple the pair of input terminals respectively from the pair of first connection terminals such that the pair of input terminals respectively receive a signal input and a reference input in the operation phase.

2. The differential comparator circuit of claim 1, wherein the pair of input terminals comprise a signal input terminal to receive the signal input in the operation phase and a reference input terminal to receive the reference input in the operation phase and one of the pair of first connection terminals is an output terminal and non-output terminal.

3. The differential comparator circuit of claim 2, wherein in the reset phase, a first voltage level of the signal input terminal, a second voltage level of the reference input terminal, a third voltage level of the non-output terminal and a fourth voltage level of the output terminal are reset to a reset voltage level equals to or larger than a sum of the cross voltage established by the cross voltage generation devices and an additional cross voltage established by the active load.

4. The differential comparator circuit of claim 3, wherein in the operation phase, the first voltage level of the signal input terminal is at a signal input level and the second voltage level of the reference input terminal ramps down from the reset voltage level to the signal input level.

5. The differential comparator circuit of claim 1, wherein the pair of the cross voltage generation devices comprise a first cross voltage generation device and a second cross voltage generation device each comprising at least one diode-connected transistor, at least one resistor, at least one biased transistor or a combination thereof.

6. The differential comparator circuit of claim 5, wherein each of the diode-connected transistor and the biased transistor is either a NMOS transistor or a PMOS transistor.

7. The differential comparator circuit of claim 1, wherein the pair of the cross voltage generation devices form a current load.

8. The differential comparator circuit of claim 1, wherein the differential input pair comprises a pair of MOS transistors having two gates as the pair of input terminals and two drains as the pair of first connection terminals.

9. The differential comparator circuit of claim 8, wherein the pair of MOS transistors are PMOS transistors and the active load is formed by NMOS transistors.

10. The differential comparator circuit of claim 8, wherein the pair of MOS transistors are NMOS transistors and the active load is formed by PMOS transistors.

11. The differential comparator circuit of claim 1, further comprising a pair of control switches respectively configured to not electrically couple two terminals of each of the cross voltage generation devices such that the cross voltage generation devices are electrically activated in the reset phase, and respectively configured to electrically couple the two terminals of each of the cross voltage generation devices such that the cross voltage generation devices are electrically deactivated to become the short circuit in the operation phase.

* * * * *